United States Patent [19]

Heckaman et al.

[11] Patent Number: 4,951,011
[45] Date of Patent: Aug. 21, 1990

[54] IMPEDANCE MATCHED PLUG-IN PACKAGE FOR HIGH SPEED MICROWAVE INTEGRATED CIRCUITS

[75] Inventors: Douglas E. Heckaman; Dawn A. Larson, both of Indialantic; Jeffrey A. Frisco, Palm Bay; David A. Haskins, Satellite Beach, all of Fla.

[73] Assignee: Harris Corporation, Melbourne, Fla.

[21] Appl. No.: 888,934

[22] Filed: Jul. 24, 1986

[51] Int. Cl.$^5$ .................... H03H 7/38; H05K 5/06
[52] U.S. Cl. ................ 333/33; 333/247; 174/52.5; 174/52.3; 357/74
[58] Field of Search ............ 333/32, 247, 33; 174/52 S, 52 H, 52.3, 52.1, 52.5; 357/74; 361/382, 386, 388

[56] References Cited

U.S. PATENT DOCUMENTS

| | | | |
|---|---|---|---|
| 3,117,179 | 1/1964 | Brown | 174/52.5 |
| 3,515,952 | 6/1970 | Robinson | 357/74 X |
| 3,528,102 | 9/1970 | Rodet et al. | 357/74 X |
| 3,671,793 | 6/1972 | Scarlett | 357/74 |
| 3,784,726 | 1/1974 | Smith et al. | 361/388 X |
| 4,644,096 | 2/1987 | Gutierrez et al. | 174/52.5 |

FOREIGN PATENT DOCUMENTS

| | | | |
|---|---|---|---|
| 85103 | 6/1980 | Japan | 333/33 |
| 0076150 | 9/1985 | Japan | 357/74 |

Primary Examiner—Eugene R. LaRoche
Assistant Examiner—Benny Lee
Attorney, Agent, or Firm—Evenson, Wands, Edwards Lenahan & McKeown

[57] ABSTRACT

A TO can-style plug-in package employs a pin/glass interface. In a first embodiment the pin/glass seal interface has a center pin of reduced diameter embedded in a smaller outer diameter, lower dielectric constant glass than a conventional TO-can. The glass is surrounded by a metal ferrule. The metallic header through which the pin/glass interfaces extend is provided with a ridge adjacent to the end of a respective pin. This increase in thickness of the header surrounding each glass-embedded center pin provides a prescribed capacitive reactance component for compensating the inductive reactance of the interiorly extending segment of the center pin and any connecting lead through which the microwave integrated component is coupled to the pin. In a second embodiment, the thickness of insulator glass that surrounds the center conductor is less than the thickness of the header.

11 Claims, 3 Drawing Sheets

IMPEDANCE MATCHED PLUG-IN PACKAGE FOR HIGH SPEED MICROWAVE INTEGRATED CIRCUITS

FIELD OF THE INVENTION

The present invention relates, in general, to the packaging of electronic circuit components and is particularly directed to a new and improved can-type plug-in package for monolithic microwave integrated circuits.

BACKGROUND OF THE INVENTION

The evolution of microelectronics circuit design and fabrication has yielded components of increased signal processing complexity and speed and which occupy a continuously decreasing (higher circuit density) circuit volume. Packaging of an appreciable variety of (low frequency) integrated circuit components (e.g. microprocessors, memories) has been effected through the use of in-line packages (dual or single) in which a microchip is encapsulated in a plastic material and interfacing to the circuitry of the chip is accomplished via a set of leads or pins that protrude from the sides of the package for engagement with a printed wiring board. For high frequency (microwave) applications, the unique dimensional tolerances and heat transfer characteristics of the devices have effectively prevented a standardized packaging scheme; instead microwave device housings have been typically custom designed, thereby contributing significant cost to production overhead. This custom configuration approach constitutes a significant drawback to the considerable strides that have been made in advanced materials technology such as gallium arsenide devices that have been employed for monolithic microwave integrated circuit devices.

One proposal to standardize the packaging of hybrid or monolithic microwave integrated circuits has been to house the circuit components in conventional T0-style plug-in cans, initially employed for discrete devices and in the early days of integrated circuit development. Because T0-style plug-in cans are part of an established packaging technology, reflecting specifications that have been standardized, they represent an attractive substitute for the costly custom designed housing configurations used for most microwave applications. Unfortunately because the conventional T0-style can was originally designed for packaging components that operate at frequencies considerably less than the signal processing bandwidth of present day microwave (e.g. GaAs-resident) devices, it has a practical upper frequency limitation on the order of 1 to 3 GHz or less.

A basic cause of this performance limitation is the dimensional parameters and materials of the plug-in leads (pins) employed in conventional T0-style cans. To meet structural rigidity, physical handling and plug-in receptor requirements of industry-standard specifications (e.g. 100 mil center-to-center pin spacings), a typical T0-8 type can may employ 18 mil diameter pins embedded in to 60 to 80 mil outer diameter glass seals, which yield a characteristic impedance Zo on the order of 35 ohms. For low frequency applications (UHF and below) the impedance mismatch (35 ohms of the pin/glass interface vs 50 ohms of the MMIC ports) presented to the signal coupling ports of the circuit components within the can does not dramatically affect circuit performance. For the considerably higher frequency range (10–40GHz) over which present day microwave integrated circuit devices are designed to operate, the impedance mismatch of the pin/glass interface of the T0-can introduces such a large and prohibitive signal coupling loss that it cannot be used, thereby necessitating housing the circuit in a custom designed package.

SUMMARY OF THE INVENTION

In accordance with the present invention, the impedance mismatch shortcomings of conventional T0 can-style plug-in housing schemes for packaging high frequency (microwave) devices are obviated by a new and improved T0 can style plug-in configuration that retains the standardization attributes of the conventional T0-style plug-in package through a pin/glass interface that appears to the external connector world as a normal plug-in configuration, but is seen by the signal coupling ports of the microwave circuit components housed within the can as a reactance adjustment network terminating each port with its circuit design (e.g. 50 ohms) impedance.

Pursuant to a first embodiment of the invention the physical parameters of the pin/glass interface are defined so as to establish the characteristic impedance (e.g. 50 ohms) required to terminate a signalling port of the microwave integrated circuit. To this end, the pin/glass seal interface of the T0 plug-in package is configured of a center conductor pin of reduced diameter (12 mils vs. 18 mils) embedded in a smaller outer diameter, lower dielectric constant glass (quartz glass) when contrasted with those of a conventional T0-style package. To ensure sufficient mechanical strength, the glass is surrounded by a metal ferrule or sleeve. The resulting lead configuration is dimensionally compatible with industry standard 100 and 50 mil center-to-center spacings of T0-style plug-in leads. Because the center conductor, which must extend into the interior of the package by an amount sufficient to provide an electromechanical connection to a prescribed lead termination on the microwave integrated circuit component (chip), is of reduced diameter, it appears, electrically, as an added inductance between the microwave chip and the outside world. To compensate for this L-reactance component interior of the pin/glass interface, the metallic header through which the pin/glass interfaces extend is provided with respective ridges adjacent to the ends of the pins. This increase in thickness of the header (ground plane), by means of a ridge surrounding each glass-embedded center pin, provides a prescribed capacitive reactance component for compensating or matching out the inductive reactance of the interiorly extending segment of the center pin and any connecting lead or ribbon through which the microwave integrated component is coupled to the pin.

In accordance with a second embodiment of the invention, rather than employ a particular glass material (e.g. quartz) and shape the header that supports the pin/glass interface so as to provide a respective ridge adjacent to the interior end portion of each center pin, the header is effectively configured as a conventional header (planar on both sides) and the glass seal material is conventional (dielectric constant $E_r$ on the order of 5). However, the cross-sectional diameters of both the center pin and the surrounding glass insulator are reduced, to provide for 50 mil center-to-center spacings of the pins. In addition, the thickness or depth of the insulator glass that surrounds the center conductor is less than the thickness of the header, so that there is an air space surrounding the reduced diameter center conductor for a portion of the thickness of the header. The thickness of the glass is such that requisite mechanical rigidity of the pin leads is maintained. By reducing the thickness of the glass, there is created an LC reactance in series with the microwave chip and the external portion of the pin. The inductance component is formed by the length of the reduced diameter center conductor protruding from the glass toward the interior of the can, whereat the pin is electrically joined to the chip by a short segment of wire or ribbon (also part of the L component). Between this protruding portion of the center pin and the interior sidewalls of the header a compensating capacitive reactance component is created. The effective characteristic impedance seen by the signal output port of the microwave integrated circuit chip is the same as that of a conventional T0-style can configuration (e.g. on the order of 35 ohms); however, by introducing the LC network the pin interface can be effectively "tuned" to a bandwidth of 10–15 GHz (or approximately an order of magnitude greater than a conventional T0 package).

As a modification of the second embodiment of the invention the "tuning" LC network may be formed by controlling the geometry of a pin length/air space interval exterior of but contiguous with the header. For this purpose, where the T0-package is mounted flush with the ground plane of a microwave transmission line, the aperture or via in the ground plane through which the center pin extends may be dimensioned over a prescribed length of the center pin to control the size and length of the air space interval adjacent to the glass seal, thereby controlling the reactance characteristics of the LC tuning network. One particularly useful transmission line configuration wherein the tuning may be readily accomplished, denoted as "waffleline", is described in copending U.S. patent application by D. Heckaman et al, Ser. No. 664,876 filed Oct. 22, 1984, now U.S. Pat. No. 4,695,810, issued Sept. 22, 1987 entitled "Waffleline Configured Microwave Transmission Link" and assigned to the Assignee of the present application. To maintain center pin-to-ground plane sidewall spacing in the air space region a suitable insulative centering ring or bead may be provided.

DETAILED DESCRIPTION

Figure 1:
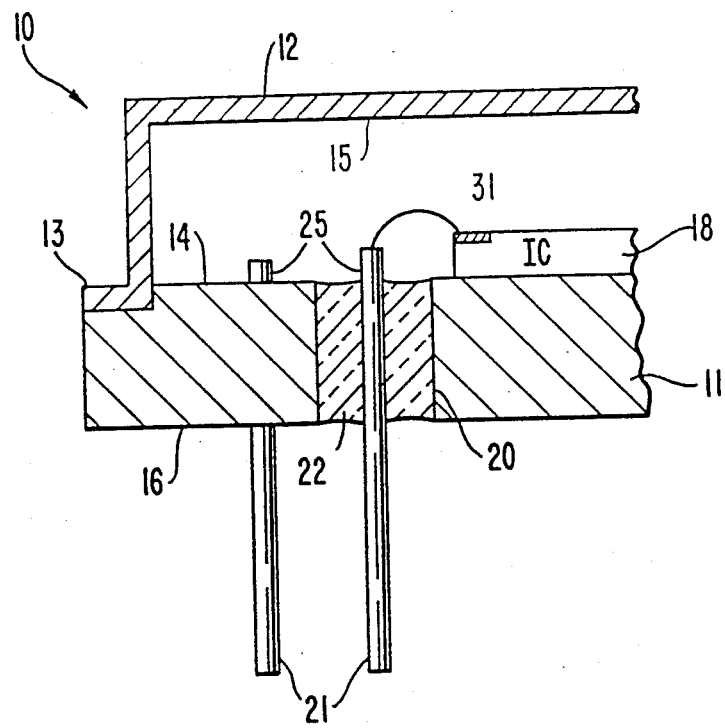
FIG. 1 is a diagrammatic cross-sectional illustration of a portion of a conventional T0 plug-in style package.

Referring to FIG. 1, the configuration of a conventional T0-style plug-in package 10 is shown as comprising a header 11 atop which is formed a cap or cover 12 having a flange 13 for engaging and sealing the perimeter of header 11. Header 11 is typically made of Kovar or other suitable metal or alloy and forms a ground plane for the package. Between the interior (top) surface 14 of the header 11 and the interior surface 15 of cover 12 there is defined a space to accommodate the circuit components that are mounted on the header. In FIG. 1 a portion of one such component, an integrated circuit chip 18, is shown as being mounted on top surface 14 of header 11. For providing (plug-in) connections to the external world, a plurality of pins 21 extend through respective apertures 20 in header 11 and are retained therein by glass seals 22, which fill each aperture and extend from the interior surface 14 of header 11 to its exterior (bottom) surface 16. Each of pins 21 has a portion 25 which protrudes slightly (on the order 15 mils) above the glass seal 22 and is connected, via a short segment of wire or ribbon 31, to a terminal lead on chip 18. Pins 21 extend beneath the exterior surface 16 of header 11 a distance sufficient to afford ease of handling and insertion into conductive apertures or slots of a mating transmission line module. To conform with industry standards the center spacing between adjacent pins is typically on the order of integral increments of 50 mils (e.g. 100 mils). Pin diameter is typically 18 mils, while the outer diameter of glass seals 22 is on the order to 60–80 mils. These dimensions result in a characteristic impedance Zo of pin 21/glass 22 interface on the order of 35 ohms. As pointed out previously, this relatively low (compared to 50 ohms) characteristic impedance, plus the parasitic reactance (inductance) of the connecting wires 31 associated with the pin assembly, has limited the use of the T0-style plug-in can arrangement to frequencies in UHF band and below.

Figure 2:
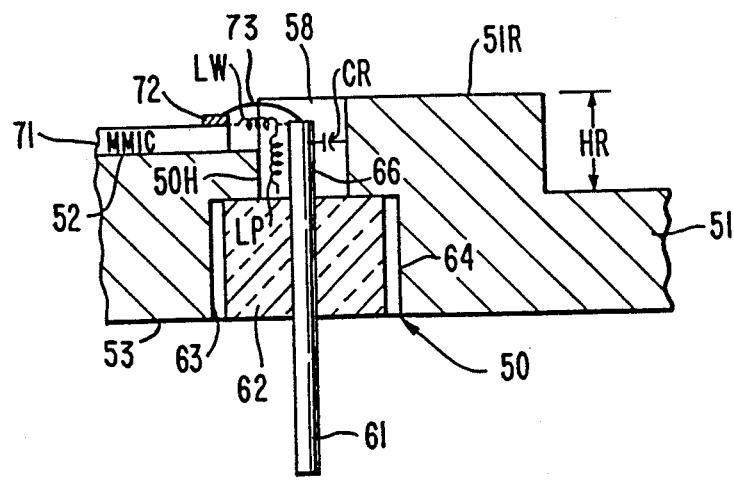
FIG. 2 is a diagrammatic cross-sectional illustration of a portion of a plug-in package for housing microwave integrated circuit components in accordance with a first embodiment of the present invention.
Figure 3:
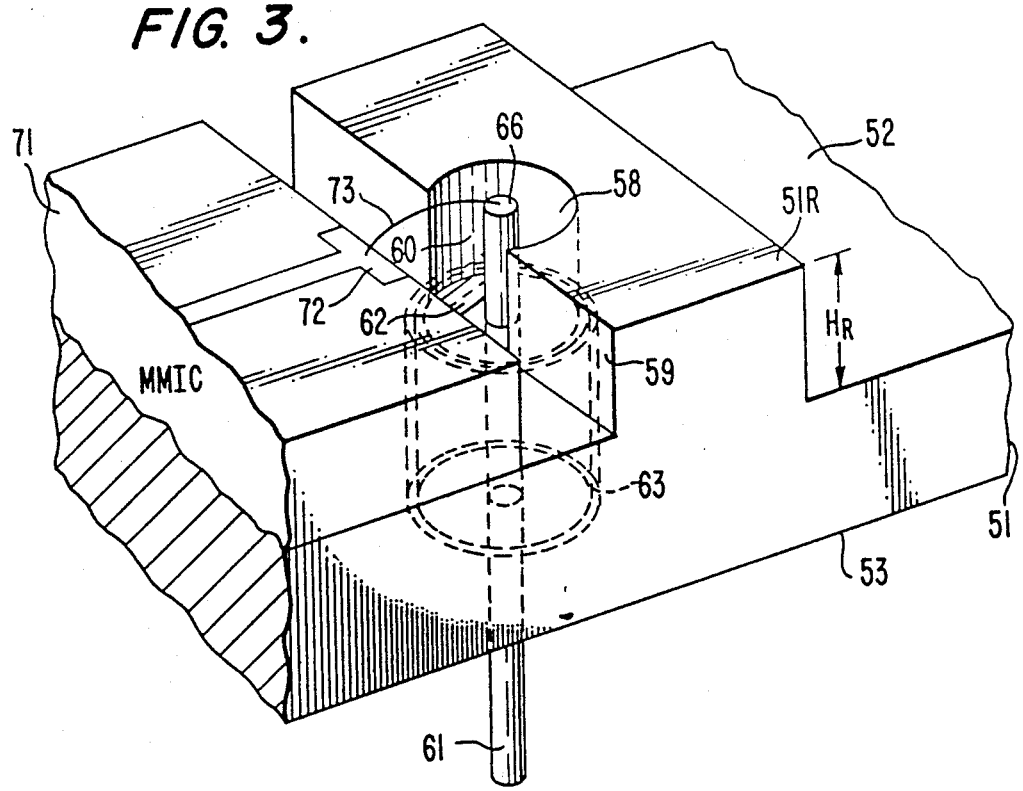
FIG. 3 is a diagrammatic perspective view of a portion of a plug-in package of the present invention, a cross-sectional view of which is shown in FIG. 2.
Figure 4:
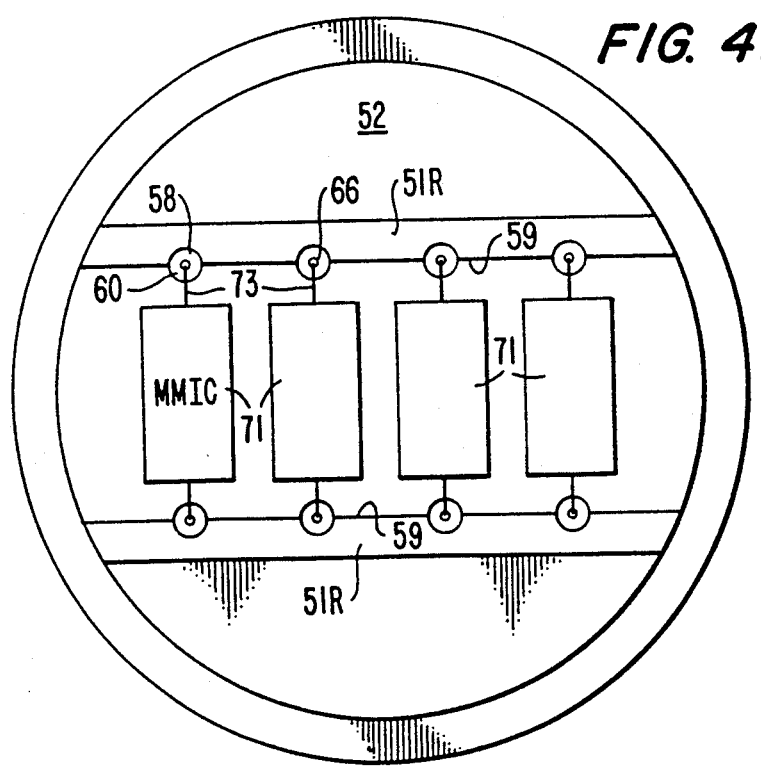
FIG. 4 is a top view of a plug-in package for housing microwave integrated circuit components in accordance with an embodiment of the present invention to which the illustrations of FIGS. 2 and 3 correspond.

Referring now to FIGS. 2–4 respective cross-sectional, perspective and plan views of a first embodiment of the present invention, that offers a marked improvement over the conventional T0-style plug-in package shown in FIG. 1, will be described. To simplify the drawings, the package cover is not shown and the header and its associated pin/glass interface configuration have been illustrated on an enlarged scale. The header 51, like the header of a conventional T0-style plug-in package, is metallic (e.g. Kovar) and provides a ground plane for the transmission line pin/glass interface between an integrated circuit component 71 and the external world. Header 51 has an interior (top) surface 52, upon which a microwave integrated circuit component 71 is mounted, and an exterior (bottom) surface 53 parallel with surface 52. The pin/glass interface is formed by a center conductor pin 61 extending through a slot or aperture 50 in header 51. Pin 61 is retained in aperture 50 by a glass seal 62 and a surrounding metallic ferrule or sleeve 63. The interior face or sidewall 64 of the aperture 50 in header 51 may be gold plated to facilitate conductive bonding of the ferrule 64 to the header 51. Preferably the glass seal 62 is a quartz glass (such as number 7070 Corning glass) which has a lower dielectric constant ($\epsilon_r$ on the order of 3.9 to 4.0) than that of the typical 7052 Corning glass ($\epsilon_r = 5$) employed in conventional T0 style plug-in packages. Moreover, the outer diameter of pin 61 is preferably on the order of 12 mils, which is considerably (33%) less than the 18 mil outer diameter of pins 21 in the prior art configuration of FIG. 1. Also, the outer diameter of glass seal 62 is only on the order of 40 mils, compared with the 60–80 mil diameter of glass bead 22 of FIG. 1. This decrease in the dimensions of pin 61 and glass seal 62 facilitates a reduction in center-to-center pin spacing to readily conform with industry standard spacings of 50 mils, 100 mils etc. By employing a glass having a smaller dielectric constant, a resulting characteristic impedance Zo of 50 ohms may be obtained. The characteristic impedance of the pin/glass interface is defined in accordance with the expression:

$$Z_o = (K/(\epsilon_r)^{\frac{1}{2}}) ln(D_{glass}/D_{pin})$$

Where K is a constant (e.g. 59.9), $\epsilon_r$ is the dielectric constant of the surrounding medium (glass)(e.g. 4.0), Dglass is the outer diameter of the glass (e.g. 66 mils) and Dpin is the outer diameter of the pin (e.g. 12 mils).

Because of the reduction in diameter of pin 61 (12 mils from 18 mils), the inductance component of the interconnect between pin 61 and the integrated circuit chip 71 is increased, thereby introducing an unwanted parasitic reactance in the signal coupling path. This increased reactance is illustrated in FIG. 2 by the inductance $L_w$ of bonding wire 73 that connects pin 61 to a lead 72 on chip 71 and the inductance $L_p$ of that portion of pin 61 extending interiorly from glass seal 62. Typically the length of portion 66 of pin 61 is on the order of 10 mils. To offset this series inductance formed by bonding wire or ribbon 73 and portion 66 of pin 61, the diameter of aperture 50 is reduced (to a value on the order of 26 mils) at a region 50H and header 51 is provided with a ridge portion 51R extending from surface 52. The height $H_R$ of ridge portion 51R slightly exceeds the length (e.g. 10 mils) of portion 66 of pin 61. Ridge 51R has a circularly-shaped opening 58 conformal with the reduced diameter region 50H of aperture 50, and facing integrated circuit chip 71. Portion 66 of pin 61 is substantially encircled by the conductive (ground plane) material of header 51 (as shown in perspective in FIG. 3 and in plan in FIG. 4), thereby forming an air dielectric transmission line between portion 66 of pin 61 and the adjacent encircling ground plane provided by header 51. Between center conductor 66 and ground plane 51 there exists a capacitive reactance $C_R$. Because the diameter of opening 58 is reduced relative to that of aperture 50 whereat glass seal 62 is provided, integrated circuit component 71 may be positioned closer to portion 66, of pin 61, thereby reducing the length (10 mils vs. 50 mils) and, consequently, the inductance $L_W$ of wire 73. In effect, ridge portion 51R of header 51 tunes out the residual inductance and wire band inductance ($L_P$ and $L_W$). A determination of the exact height $H_R$ and spacing (opening 58) of the circular sidewall of ridge 51R depends upon intended frequency of operation, wire size and glass composition. Consequently, it has been found that dimensioning of ridge 51R to achieve desired matching is most simply accomplished by trial and error. For providing a range of performance of up to 40 GHz, a pin diameter of 12 to 14 mils, glass seal diameter of 65 to 67 mils, dielectric constant $\epsilon_r$=3.9 to 4.1, the height of ridge 51R may be from 16 to 18 mils. By appropriate changes in dimensions and materials the effective characteristic impedance may be controlled over a range of 30 to 100 ohms over the 40 GHz bandwidth.

The only region around pin portion 66 of pin 61 which is not encircled by ridge 51R is the opening 60 on side face 59 of ridge 51R facing microwave integrated circuit chip 71 where wire or ribbon 73 connects chip lead 72 with pin portion 66. Because the height $H_R$ of ridge 51R is only slightly greater than the 10 mil length of pin portion 66, there are no wall obstructions, thereby making the T0 package compatible with conventional hybrid and monolithic wire bonding and die attachment equipment.

In the foregoing embodiment of the invention, dimensioning of and choice of material for the pin/seal interface make it possible to provide a characteristic impedance of 30 to 100 ohms (typically at 50 ohms) at microwave frequencies of up to 40 GHz. As an alternative to the use of quartz glass and tooling the header to have respective ridges surrounding each pin/glass interface, a significant degree of improved performance over presently existing T0-style package configurations can be obtained by controlling the geometry of the pin/seal interface itself within the header aperture whereat the glass seal is provided. In accordance with this second embodiment of the invention, respective alternative forms of which are diagrammatically shown in FIGS. 5–7, a header 81 has a pair of spaced apart substantially planar parallel surfaces 82 and 83 as in a conventional T0-style plug-in package, rather than the ridged configuration of FIGS. 2–4. The pin/glass interface within an aperture 84 through the header 81 is formed of a bead of sealing glass 85 such as the above-mentioned conventional Number 7052 glass ($\epsilon_r$=5) and a pin 86 supported within and dielectrically isolated from the conductive (effective ground plane) header 81 by glass bead 85. Pin 86 may be of reduced diameter (12 mils) as in the first embodiment shown in FIGS. 2–4. Also, the diameter of aperture 84 may be of reduced dimension (on the order of 40 mils) as in the above-described first embodiment.

Figure 5:
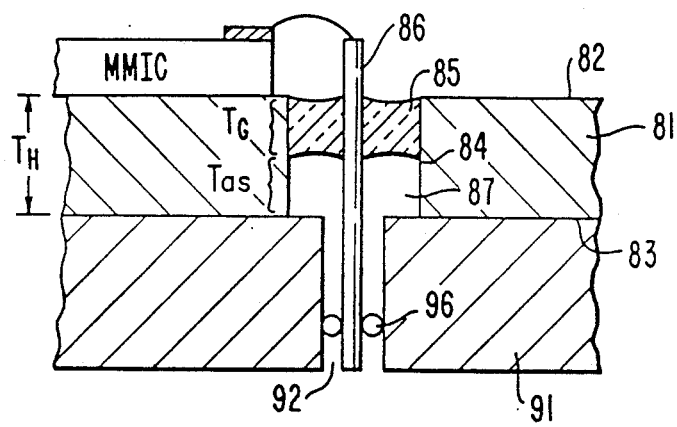
FIG. 5 is a diagrammatic cross-sectional illustration of a portion of a plug-in package for housing microwave integrated circuit components in accordance with a second embodiment of the invention.

In the configuration shown in FIG. 5, the thickness $T_G$ of glass bead 85 is less than the thickness $T_H$ of header 81, thereby creating an air space 87 within that portion of aperture 84 whereat glass bead 85 is not provided around pin 86. This air space effectively extends to the plane of surface 83 whereat header 81 is contiguous with a transmission line ground plane structure 91 (such as a waffleline plate described in the above-referenced copending patent application) through a via 92 through which pin 86 passes for connection to a center conductor of the transmission line network of the waffleline. An alignment ring or bead of insulator material 96 may surround pin 86 in via 92 to facilitate the centering of pin 86 in via 92. In the configuration shown in FIG. 6, the thickness $T_G$ of glass bead 85 is also less than the thickness $T_H$ of header 81. In addition, a portion 93 of the via 92 through ground plane structure 91 surrounding pin 86 is of enlarged diameter compared with that of the reminder of via 92 so that the total thickness $T_{as}$ of the enlarged air space surrounding pin 86 includes air space 87 and air space 93. In a further configuration shown in FIG. 7, the thickness of glass bead 85 effectively corresponds to the thickness of header 81. An enlarged air space 93 is provided in a portion of via 92 adjacent header 91 surrounding pin 86, as shown.

Figure 6:
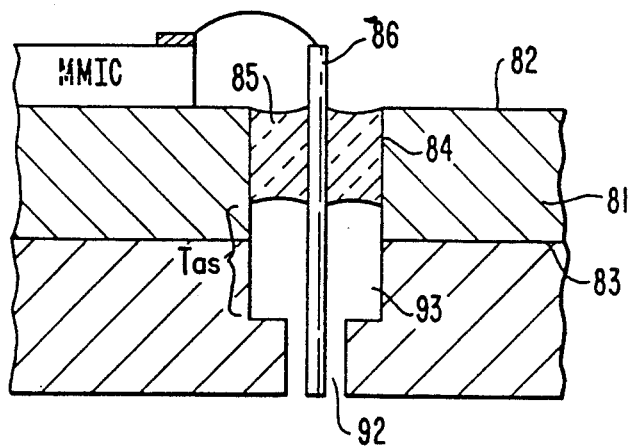
FIGS. 6 and 7 are diagrammatic cross-sectional illustrations of modifications of a portion of a plug-in package of the embodiment of the invention shown in FIG. 5.
Figure 7:
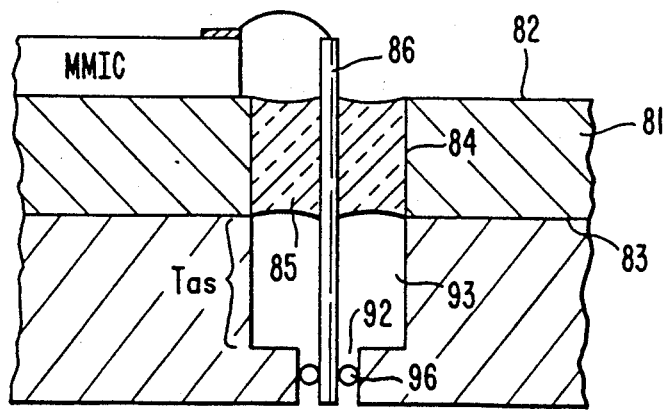

In each of the configurations of FIG. 5, 6 and 7 an airspace region of thickness $T_{as}$, which may include an enlarged portion 93 of a center conductor via 92 in the ground plane structure (waffleline plate) 91, is employed to provide a controllable or tunable LC matching network. Namely, pin 86 forms an inductive reactance component $L_p$ together with the induction of a wire or ribbon 93 joining pin 86 to an MMIC 95 within the T0 package, as in the first embodiment. In addition, a capacitive reactance is formed between pin 86 and 0 the conductive ground plane of header 81 and any transmission line conductive medium 91, such as a waffleline plate on which the T0 package is mounted, as mentioned above. By controlling the length and cross-sectional area of the air space 91 surrounding pin 86 (both within aperture 84 of header 81 at 5 region 87 and in any adjacent plate, as shown by region 93 around pin 86), the L and C parameters of the matching network may be tuned to cause the effective characteristic impedance of 35 ohms of the pin/glass interface meet performance objectives of the microwave integrated circuit up to 20GHz.

As in the first embodiment, dimensioning of the airspace around pin 86, thereby tailoring the inductive and capacitive reactance components of the tuning network, is most readily carried out on a trial and error basis. As a non-limitative example, for a center pin diameter of 18 mils, glass bead diameter of 80 mils and a thickness of 60 mils, air space thickness of 40 mils, aperture diameter of 80 mils glass dielectric constant of $\epsilon_r = 5.0$, a bandwidth of up to 14 GHz is obtainable.

As will be appreciated from the foregoing description, the frequency performance limitations of conventional T0 can-style plug-in housing schemes for packaging high frequency monolithic microwave integrated circuits are obviated by a new and improved T0 can style plug-in configuration that retains the standardization qualities of previous schemes through a pin interface that appears to the external connector world as a normal plug-in configuration, but is seen by the signal coupling ports of the microwave circuit components housed within the can as a reactance adjustment network effectively terminating each port with a 50 ohm impedance.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A plug-in package for housing circuit components comprising:
    a conductive support header upon which one or more circuit components are mounted, said support header having at least one aperture therethrough extending from an interior portion of said package, whereat a respective one of said one or more circuit components is mounted, to an exterior portion thereof;
    a respective conductor pin supported within and extending through a respective one of said at least one aperture, said conductor pin being conductively coupled to said respective one circuit component at a first portion thereof at said interior portion of said package, said pin forming an inductive reactance component between said respective one circuit component and the exterior of said package; and
    a respective dielectric insulator surrounding said respective conductor pin and being mechanically coupled to said header so as to support said respective conductor pin in a respective at least one aperture; and wherein
    a prescribed region of said aperture through which said pin extends has a dielectric constant different from that of said insulator so as to form a prescribed capacitive reactance between said pin and said header, and forms with the inductive reactance of said pin a prescribed inductive-capacitance impedance matching network between said respective one circuit component and the exterior of said package, and wherein said support header has a pair of opposite, substantially parallel surfaces through which said respective at least one aperture extends, a first of said surfaces corresponding to said interior portion of said package and supporting said respective one circuit component thereon; and wherein
    said package is adapted to be mounted on a conductive transmission line support member having a respective at least one aperture therein for receiving said conductor pin; and wherein
    said aperture in said support header is a generally cylindrical aperture of a constant diameter extending through said header and the aperture in said conductive transmission line support member has a circular cross-section, a first portion of the support member aperture having a diameter corresponding to that of the generally cylindrical aperture in said header and is formed so as to be aligned with the aperture in said header, and wherein the thickness of said dielectric insulator through said header is less than the length of the aperture in said header so as to form an airspace surrounding a prescribed portion of said conductor pin in both the aperture in said header and the aperture in said support member in alignment therewith, said airspace corresponding to said prescribed region whereat said prescribed capacitive reactance is formed between said conductor pin and the conductive material of said header and said support member.

2. A plug-in package according to claim 1, further including an insulative alignment spacer surrounding said conductor pin within the aperture in said support member.

3. A plug-in package for housing circuit components comprising:
    a conductive support header upon which one or more circuit components are mounted, said support header having at least one aperture therethrough extending from an interior portion of said package, whereat a respective one of said one or more circuit components is mounted, to an exterior portion thereof;
    a respective conductor pin supported within and extending through a respective aperture, said conductor pin being conductively coupled to said respective one circuit component at a first portion thereof at said interior portion of said package, said pin forming an inductive reactance component between said respective one circuit component and the exterior of said package; and
    a respective dielectric insulator surrounding said pin and being mechanically coupled to said header so as to support said pin in said respective at least one aperture; and wherein
    a prescribed region of said aperture through which said pin extends has a dielectric constant different from that of said insulator so as to form a prescribed capacitive reactance between said pin and said header, and forms with the inductive reactance of said pin a prescribed inductive-capacitance impedance matching network between said respective one circuit component and the exterior of said package, and wherein said support header has a pair of opposite, substantially parallel surfaces through which said respective at least one aperture extends, a first of said surfaces corresponding to said interior portion of said package and supporting said respective one circuit component thereon; and wherein said support header has a respective ridge portion extending above said first surface so as to define an extension of said respective at least one aperture into the interior portion of said package, said respective ridge portion having a sidewall portion that intersections said extension of said aperture, so that an opening is formed in said sidewall, through which opening said conductor pin is exposed, said extension of said aperture by way of said ridge portion partially surrounding said conductor pin and defining therewith said prescribed capacitive reactance; and, wherein the sidewall of said ridge portion is effectively conformal with a sidewall of said support header, so that said integrated circuit component may be placed in closely spaced proximity of the extension of said aperture and thereby reduce the distance of the conductive coupling between said circuit component and said conductor pin.

4. A plug-in package according claim 3, wherein the height of said ridge above said first surface of said header exceeds the length by which said conductor pin extends into said interior portion of said package from said first surface.

5. A plug-in package for housing microwave integrated circuit components comprising:
a support header upon which a plurality of microwave integrated circuit components are mounted, said support header having a pair of opposite substantially parallel surfaces through which extend a plurality of apertures from an interior portion of said package, whereat said microwave integrated circuit components are mounted, to an exterior portion of said package, and a plurality of ridge portions which extend from a first of said surfaces at said interior portion of said package to a prescribed height thereabove, each respective ridge portion being shaped to define a respective extension of each of said apertures into the interior portion of said package, and having a sidewall portion that intersections the extension of a respective aperture, so that a respective opening is formed in said sidewall, through which opening a respective aperture extension is exposed to a respective microwave integrated circuit package;
a respective conductor pin supported within and extending through a respective aperture, said respective conductor pin being conductively coupled to a respective microwave integrated circuit component at a first portion thereof, said respective conductor pin forming an inductive reactance component between said respective microwave integrated circuit component and the exterior of said package; and
a respective dielectric insulator surrounding said respective conductor pin in said respective aperture and being mechanically coupled to said header so as to support said respective conductor pin in said respective aperture; and wherein
said respective extension of said aperture forms an airspace around said first portion of said pin so as to form therewith a prescribed capacitive reactance between said pin and the ridge portion of said header, which, together with said inductive reactance, forms an inductive-capacitive impedance matching network between a respective microwave integrated circuit component and the exterior of said package.

6. A plug-in package according claim 5, further including a respective conductive ferrule disposed in each said aperture and coaxially surrounding said respective dielectric insulator.

7. A plug-in package according claim 5, wherein the height of each said ridge above said first surface of said header exceeds the length by which said conductor pin extends into said interior portion of said package from said first surface of said header.

8. A plug-in package according claim 7, wherein the materials and dimensions of said header, aperture, conductive pin and dielectric insulator are such as to provide a controlled characteristic impedance between 30 and 100 ohms over a frequency range above 10 GHz.

9. A plug-in package for housing integrated circuit components comprising:
a conductive support structure upon which one or more microwave integrated circuit components are mounted; and
at least one microwave signal feedthrough extending through said support structure for the transmission of microwave signals between a respective one of said one or more microwave integrated circuit components mounted on said support structure and the exterior of said package, each said microwave signal feedthrough comprising:
a respective aperture extending through said support structure from an interior portion of said package, whereat a respective integrated circuit component is mounted, to an exterior portion thereof;
a respective conductor pin supported within and extending through said respective aperture, said conductor pin being conductively coupled to said respective integrated circuit component at a first portion thereof at said interior portion of said package, said conductor pin forming an inductive reactance component between said integrated circuit component and the exterior of said package, and
a respective dielectric insulator surrounding a first portion of said pin and being mechanically coupled to said support structure so as to support said pin in said respective aperture and to define a first characteristic impedance of said feedthrough thereat, and wherein
at a second portion of said pin within said aperture, other than where said respective dielectric insulator surrounds said first portion of said pin, the characteristic impedance of said feedthrough is different than at said first portion thereof, wherein
at said second portion of said pin, the dielectric constant of said aperture is different from that of said dielectric insulator, so as to form a capacitive reactance between said pin and said support structure and to form with the inductive reactance of said pin a prescribed inductive-capacitive impedance matching network between said respective microwave integrated circuit component and the exterior of said package, said aperture is a cylindrical aperture the diameter of which at said first and second portions of said pin is the same, and wherein at a third portion of said pin within said aperture, the characteristic impedance of said feedthrough is different than at said second portion of said pin.

10. A plug-in package according to claim 9, wherein the diameter of said aperture at said third portion of said pin is different than the diameter of said aperture at said second portion of said pin.

11. A plug-in package for housing circuit components comprising:

a conductive support header upon which one or more circuit components are mounted, said support header having at least one aperture therethrough extending from an interior portion of said package, whereat a respective one of said one or more circuit components is mounted, to an exterior portion thereof;

a respective conductor pin supported within and extending through a respective at least one aperture, said conductor pin being conductively coupled to said respective one circuit component at a first portion thereof at said interior portion of said package, said pin forming an inductive reactance component between said respective one circuit component and the exterior of said package; and a respective dielectric insulator surrounding said pin and being mechanically coupled to said header so as to support said pin in said respective at least one aperture; and wherein a prescribed region of said aperture through which said pin extends has a dielectric constant different from that of said insulator so as to form a prescribed capacitive reactance between said pin and said header, and forms with the inductive reactance of said pin a prescribed inductive-capacitance impedance matching network between said respective circuit component and the exterior of said package, and wherein said support header has a pair of opposite, substantially parallel surfaces through which said respective at least one aperture extends, a first of said surfaces corresponding to said interior portion of said package and supporting said respective one circuit component thereon; and wherein said package is adapted to be mounted on a conductive transmission line support member having a respective at least one aperture therein for receiving said conductor pin; and wherein said aperture in said support header is a generally cylindrical aperture of a constant diameter extending through said header and the aperture in said conductive transmission line support member has a circular cross-section, a first portion of the support member aperture has a diameter corresponding to that of the generally cylindrical aperture in said header and is formed so as to be aligned with the aperture in said header and wherein the thickness of said dielectric insulator through said header corresponds to the thickness of said header and wherein the aperture in said support member forms an airspace surrounding a prescribed portion of said conductor pin corresponding to said prescribed region whereat said prescribed capacitive reactance is formed between said conductor pin and the conductive material of said header and said support member.

* * * * *